ALUMINUM-ALLOY JUNCTION DEVICES USING
SILICON NITRIDE AS A MASK
Filed Aug. 12, 1968

INVENTORS
RAJENDRA R. MEHTA
RICHARD G. SWANN
BY THOMAS P. CAUGE
Philip [signature]
ATTORNEY

United States Patent Office 3,576,684
Patented Apr. 27, 1971

3,576,684

ALUMINUM-ALLOY JUNCTION DEVICES USING SILICON NITRIDE AS A MASK

Rajendra R. Mehta, Mountain View, Calif., Richard G. Swann, North Palm Beach, Fla., and Thomas P. Cauge, Mountain View, Calif., assignors to International Telephone and Telegraph Corporation, Nutley, N.J.

Filed Aug. 12, 1968, Ser. No. 752,062
Int. Cl. H01l 7/46
U.S. Cl. 148—179 9 Claims

ABSTRACT OF THE DISCLOSURE

This is an improved method of manufacturing semiconductor devices, in particular low voltage Zener diodes, having aluminum-alloy pn-junctions. The improvement in manufacture results from using silicon nitride instead of silicon dioxide to passivate and mask the surface of a wafer, silicon nitride being impervious to aluminum whereas silicon dioxide tends to interact with aluminum at temperatures where alloying is performed in a manner which is deleterious to the device. After silicon nitride is deposited on the wafer surface, windows are etched therein and aluminum is deposited over the entire surface. Since silicon nitride is impervious to aluminum, the aluminum can be alloyed into the substrate through the window without having to remove the aluminum from the surface of the silicon nitride.

BACKGROUND OF THE INVENTION

This invention relates to an improved method of manufacturing aluminum alloyed junction devices, in particular Zener diodes.

Prior methods of manufacturing aluminum alloyed junction semiconductor devices used silicon dioxide to passivate the surface of the wafer. After the silicon dioxide mask is applied to the wafer, windows are usually etched in the oxide layer to expose portions of the silicon wafer surface. The wafers are then cleaned and placed in a vacuum evaporation apparatus, such as a bell jar, under a tungsten filament. Aluminum is then coiled around the tungsten filament. The bell jar is evacuated and the aluminum is first melted and then vaporized by the heated filament. The thin film of aluminum is then deposited over the surface of the water. For the purpose of mass production it would then be most convenient to directly alloy the aluminum through the window into the wafer, forming an ohmic contact with the silicon and a pn-junction therein. However, the aluminum has a tendency to penetrate the oxide surface if the alloying occurs at too great a temperature-time product which will cause shorting of the pn-junction just previously formed. This occurs because aluminum is a good reducing agent for silicon dioxide and tends to react with the silicon dioxide until a channel is formed connecting the underlying silicon with the aluminum layer. Therefore, to avoid this deleterious effect, it would be necessary to remove the aluminum from the silicon dioxide surface before we begin to alloy the aluminum with the silicon. However, even after the aluminum is removed from the oxide surface, the aluminum which remains in the window is in contact with the oxide layer and the same undesirable interaction between the aluminum and silicon dioxide layer still occurs. This method is thus both costly and obviously unsatisfactory.

The following method, described in Weinerth 10, U.S. Patent application No. 695,747, filed Jan. 4, 1968, has been used when making inexpensive low voltage Zener diodes to overcome some of the obvious disadvantages of the above method. In Weinerth 10, a dot of aluminum is evaporated on the silicon substrate through a window formed in the silicon dioxide layer in a manner which insures that the aluminum dot never touches the silicon dioxide layer. The aluminum dot is then alloyed through a previously formed shallow pn-junction within a temperature gradient of an increasing temperature in a direction towards the center of the water. The disadvantages of this method arise from the difficulty of placing the dots within the window wherein the size of the device formed is limited by the minimum size of the aluminum dot which can be deposited without touching the oxide layer while using conventional manufacturing techniques. This method, therefore, still appears costly and is restricted to producing relatively large Zener diodes.

SUMMARY OF THE INVENTION

It is an object of this invention to provide an improved method of manufacturing semiconductor devices.

It is another object to provide a less expensive manufacturng process for low voltage Zener diodes, particularly of the small planar type.

According to one aspect of the invention there is provided a method of manufacturing semiconductor devices having aluminum-alloy pn-junctions comprising the steps of depositing a layer of silicon nitride on a surface of a substrate, etching a window in said layer exposing a portion of the surface of said substrate, depositing a layer of aluminum over said silicon nitride layer and said exposed surface, and alloying said aluminum into said substrate through said window to form a pn-junction therein.

Another aspect of this invention provides a method of manufacturing Zener diodes having aluminum-alloy pn-junctions on a substrate of n conductivity type comprising the steps of forming a region of p conductivity type within a portion of a surface of said substrate, depositing a layer of silicon nitride on said substrate, etching a window in said layer exposing a portion of said surface area within the marginal area of said region, depositing a layer of aluminum over said silicon nitride layer and said exposed surface area, and alloying said aluminum in through said window and region within a temperature gradient of increasing temperature towards the center of said substrate.

BRIEF DESCRIPTION OF THE DRAWINGS

The invention will be more clearly understood by reference to the accompany drawings in which.

DESCRIPTION OF THE PREFERRED EMBODIMENTS

Figure 1:
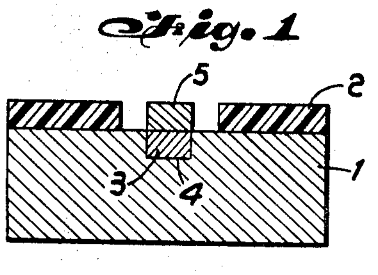
FIG. 1 is a schematic diagram of a device used in explaining prior art techniques.

Referring now to FIG. 1, an aluminum-alloy junction device is shown which was manufactured by a prior art method. A silicon substrate 1 has a layer of silicon dioxide 2 formed on its surface. A window is etched in the oxide layer using known etchants. An aluminum dot is deposited within the window and is alloyed into the substrate forming a region 3 of p conductivity type material, pn-junction 4 and ohmic contact 5. Care must be taken to make sure that the aluminum dot does not come in contact with the oxide layer, otherwise during the subsequent alloying step, the aluminum will attack and disintegrate the oxide. The tolerances required between the aluminum and oxide windows in practical manufacturing procedures results in relatively large area Zener diodes being formed.

Figure 2A:
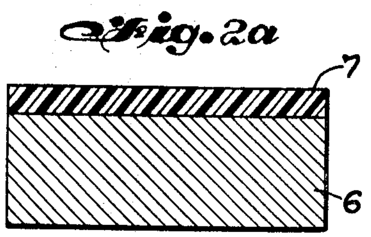
FIGS. 2*a* to 2*d* show the steps in manufacturing a single device according to one embodiment of the invention.

One embodiment of this invention is shown in FIGS. 2*a* to 2*d* depicting the steps in manufacturing a semiconductor device having an aluminum-alloy junction formed therein. FIG. 2*a* shows silicon substrate 6 of n conductivity type with a silicon nitride layer 7 of approximately 2000 angstroms thick formed thereon. The deposition of the silicon nitride layer can be accomplished by techniques described in H. F. Sterling-C. F. Drake 30–26, U.S. Patent application No. 700,215 filed Jan. 24, 1968, wherein the layer is deposited by pyrolysis from an atmosphere of silane (silicon tetrahydride) and ammonia, $$3SiH_4+4NH_3 \rightarrow Si_3N_4+12H_2$$

In this method the activation energy is supplied by an electrical (glow) discharge established in the atmosphere surrounding the device (for example, by a high frequency electric field) at a temperature of about 900° C. The ratio of ammonia to silane introduced in the atmosphere ranges from 10 to 30:1.

Figure 2B:
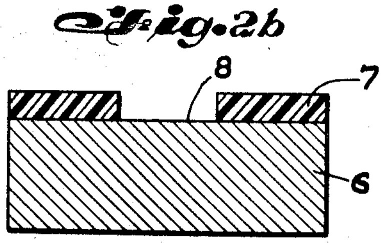
Figure 2C:
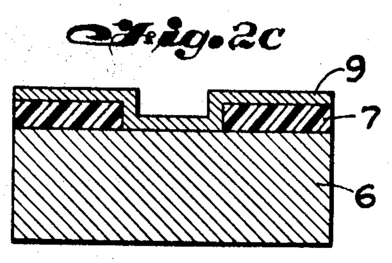
Figure 2D:
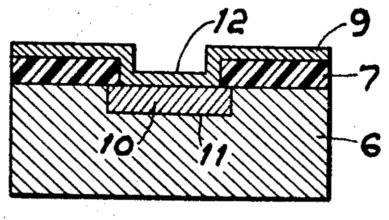
Figures 3, 4:
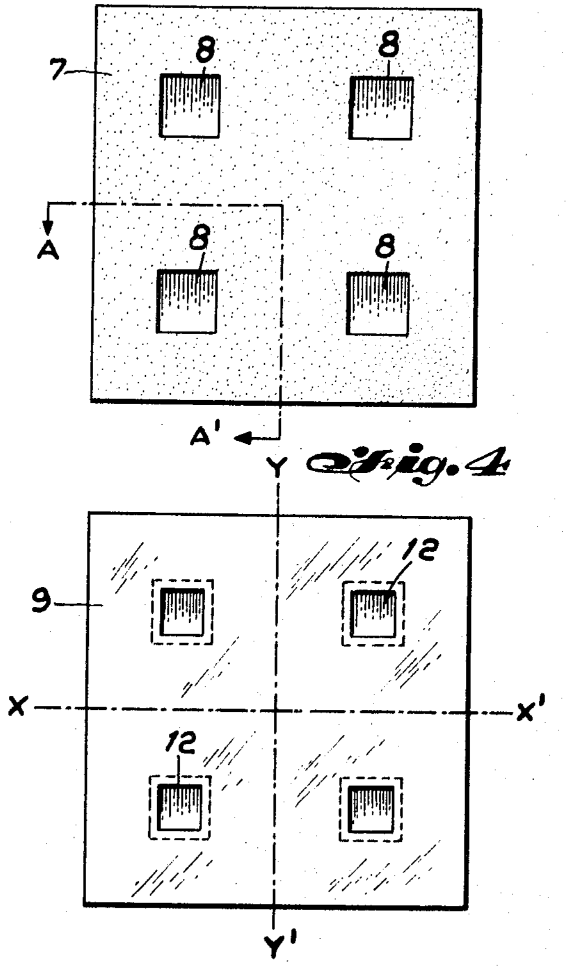
FIG. 3 shows the plurality of windows being etched on the substrate during the manufacture of the device shown in FIG. 2*d*, FIGS. 2*a* to 2*d* being a secion of FIG. 3 represented by line A–A'.
FIG. 4 shows a plurality of devices manufactured according to FIGS. 2*a* to 2*d* which will be separated into individual units by dividing the substrate along lines *x–x'* and *y–y'*.

Windows 8 are then etched in the nitride layer to expose the silicon surface as shown in FIG. 3. Since FIGS. 2*a* to 2*d* are only a section of the wafer taken from within line A–A' of FIG. 3, these figures are only depicting the formation of a single device and FIG. 2*b* shows only one window 8 formed therein.

FIG. 2*c* shows the aluminum layer 9 being evaporated over the entire wafer surface by techniques described in the prior art previously discussed.

In the next step, if the alloying is performed at the eutectic temperature (576° C.) of aluminum and silicon, the aluminum and silicon dissolve at their interface forming a liquid sheet, the eutectic temperature being the minimum temperature at which any possible combination of aluminum and silicon would melt. However, in this process alloying is performed by heating the wafer to approximately 1000° C. for about 2 minutes. Since the alloying is carried out above the eutectic temperature, a greater percentage of silicon enters the liquid sheet. Now when the wafer is brought below the eutectic temperature, the additional silicon which entered the liquid sheet when the wafer was heated above the eutectic temperature is rejected from the liquid sheet, thereby forming a regrowth region 10 of silicon which contains a small percentage of aluminum. FIG. 2*d* shows the regrowth region 10 thus formed which is of p conductivity type having a pn-junction 11 and an aluminum silicon ohmic contact 12.

The wafer can then be broken up into separate devices forming individual aluminum-alloy junction diodes by dividing the wafer along the lines *x–x'* and *y–y'* of FIG. 4.

Figure 5:
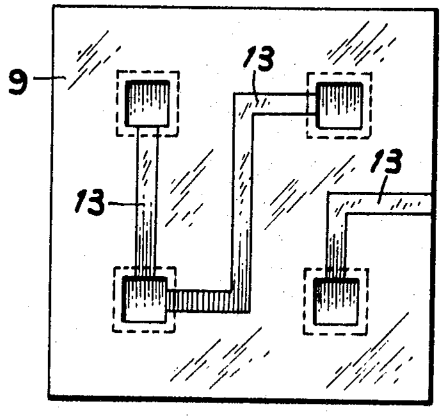
FIG. 5 shows the devices manufactured according to FIGS. 2*a* to 2*d* forming an integrated circuit.

Alternatively, the wafer can constitute an integrated circuit having a number of aluminum-alloy junction diodes thus formed thereon as shown in FIG. 5. This can be accomplished by removing aluminum from portions of the silicon nitride layer to expose the nitride layer 7, using an aluminum etchant subsequent to the aluminum-alloying step, thereby forming terminals for the diodes and the desired interconnecting pattern 13 for the integrated circuit.

Figure 6:
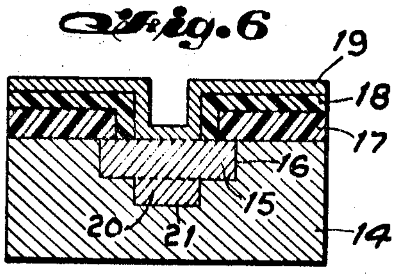
FIG. 6 is a device manufactured by a second embodiment of the invention.

FIG. 6 shows a device that has the same operating characteristics as the low voltage Zener diode disclosed in Weinerth 10, U.S. Patent application No. 695,747, filed Jan. 4, 1968. By using the inventive concepts of this invention to manufacture the device shown in FIG. 6 results in a process having improved manufacturing efficiency and an overall reduction in the cost of production. This is accomplished by first starting with substrate 14 typically silicon of n conductivity type although other materials could be used in its place. A p type region 15 having pn-junction 16 formed within the silicon body is formed by known planar techniques. One such technique would be to deposit a silicon dioxide layer 17 over the surface of the wafer, followed by etching an appropriate window in the oxide layer and then diffusing p type material in through the window into the substrate thus forming region 15.

Now instead of placing a dot of aluminum within the oxide layer so as not to touch the oxide, we follow the teaching of this invention and cover the entire wafer surface with a silicon nitride layer 18. Then a window is etched in the silicon nitride layer which will define the desired alloy junction area. This is followed by depositing a layer of aluminum over the whole wafer surface. The wafer is then heated to alloy the aluminum through the window and previously formed region 15 within a temperature gradient of increasing temperature is a direction toward the inside of the wafer until the desired depth is reached thereby forming auxiliary region 20 having additional pn-junction 21. Since voltage breakdown will occur at junction 21 before it will occur at junction 16 the Zener breakdown voltage of the device is controlled by the alloyed junction 21 thus formed.

A large number of these devices can of course be made simultaneously on a single large wafer by forming a plurality of windows in the oxide and nitride layers. After the alloying step is completed the device can then be separated into individual units as described with reference to FIG. 4.

The techniques for manufacturing the devices shown in FIGS. 2 to 6 have the advantage that large quantities of aluminum-alloy junction devices can be more quickly and efficiently made than by prior methods because the aluminum can now be deposited over the whole wafer surface and need not be removed either before or after the alloying step. These devices are also appreciably reduced in physical size since the minimum dimension of the alloy junction is now limited by the smallest window which can be etched in the silicon nitride layer.

We claim:

1. A method of manufacturing semiconductor devices having aluminum-alloy pn-junctions comprising the steps of:
- depositing a layer of silicon nitride on a surface of a substrate;
- forming a window in said layer exposing a portion of the surface area of said substrate;
- depositing a layer of aluminum over said silicon nitride layer and said exposed surface area; and
- alloying said aluminum into said substrate through said window to form a pn-junction therein.

2. A method of manufacturing Zener diodes having aluminum-alloy pn-junctions on a substrate of n-conductivity type comprising the steps of:
- forming a region of p conductivity within a portion of a surface of said substrate;
- depositing a layer of silicon nitride over the surface of said diode;
- etching a window in said layer exposing a portion of said surface area within the marginal area of said region;
- depositing a layer of aluminum over said silicon nitride layer and said exposed surface area; and
- alloying said aluminum in through said window and region within a temperature gradient of increasing temperature in a direction towards the inside of said substrate.

3. A method of manufacturing a semiconductor device according to claim 1 wherein said device is an integrated circuit having a plurality of aluminum-alloy Zener diodes formed therein by etching a plurality of windows in said silicon nitride layer before depositing said aluminum layer over said silicon nitride layer and windows.

4. A method of manufacturing a semiconductor device according to claim 3 further comprising the step of:
removing aluminum from portions of said silicon nitride layer after the alloying step to form terminals for said diodes and interconnection patterns for said device.

5. A method of manufacturing a semiconductor device according to claim 4 wherein an aluminum etchant is used to remove said aluminum.

6. A method of manufacturing a semiconductor device according to claim 1 wherein a layer of said silicon nitride having a thickness of approximately 2000 angstroms is deposited by electrical discharge from an atmosphere of silane and ammonia at a temperature of about 900° C.

7. A method of manufacturing a semiconductor device according to claim 1 wherein said alloying is performed at a temperature of about 1000° C. for approximately 2 minutes.

8. A method of manufacturing a semiconductor device according to claim 1 wherein a plurality of said devices are formed on said substrate by etching a plurality of windows in said silicon nitride layer before said aluminum layer is deposited, and said substrate is divided into individual devices after the alloying step.

9. A method of manufacturing a semiconductor device according to claim 8 wherein said device is an aluminum-alloy junction Zener diode.

References Cited

UNITED STATES PATENTS

| | | | |
|---|---|---|---|
| 2,748,041 | 5/1956 | Leverenz | 29—583X |
| 3,237,271 | 3/1966 | Arnold et al. | 29—578 |
| 3,382,568 | 5/1968 | Kuiper | 29—578 |
| 3,437,533 | 4/1969 | Dingwall | 148—188X |
| 3,469,155 | 9/1969 | Van Beek | 29—571X |
| 3,455,020 | 7/1969 | Dawson et al. | 148—187X |

JOHN F. CAMPBELL, Primary Examiner

W. TUPMAN, Assistant Examiner

U.S. Cl. X.R.

148—180; 29—578; 317—235